US006380800B1

(12) United States Patent
Huber

(10) Patent No.: US 6,380,800 B1
(45) Date of Patent: Apr. 30, 2002

(54) PUMP AREA REDUCTION THROUGH THE USE OF PASSIVE RC-FILTERS OR ACTIVE FILTERS

(75) Inventor: Brian W. Huber, Allen, TX (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/475,164

(22) Filed: Dec. 30, 1999

(51) Int. Cl.$^7$ .................................................. H03B 1/00
(52) U.S. Cl. ........................................ 327/552; 327/553
(58) Field of Search .............................. 327/156, 157, 327/158, 159, 536, 537, 552, 553, 558, 555, 556, 559; 363/59, 60; 331/17

(56) References Cited

U.S. PATENT DOCUMENTS

| | | | | |
|---|---|---|---|---|
| 3,522,457 A | * | 8/1970 | Perra ............................. 327/555 |
| 4,134,026 A | * | 1/1979 | Sone et al. ..................... 307/137 |
| 4,712,233 A | * | 12/1987 | Kuo ............................... 379/386 |
| 5,023,465 A | | 6/1991 | Douglas et al. ............... 365/203 |
| 5,126,590 A | | 6/1992 | Chern ............................ 327/536 |
| 5,394,320 A | | 2/1995 | Blodgett ......................... 363/60 |
| 5,394,365 A | | 2/1995 | Tsukikawa .................. 365/189.09 |
| 5,404,250 A | * | 4/1995 | Hase et al. ..................... 327/157 |
| 5,559,474 A | * | 9/1996 | Matsumoto et al. ............ 331/17 |
| 5,656,975 A | * | 8/1997 | Imura ............................. 331/11 |
| 5,731,736 A | * | 3/1998 | Ezel ............................... 327/536 |
| 5,757,216 A | * | 5/1998 | Murata .......................... 327/156 |
| 5,892,407 A | * | 4/1999 | Ishii ............................... 331/17 |

* cited by examiner

Primary Examiner—Matthew Smith
Assistant Examiner—Paul Dinh
(74) Attorney, Agent, or Firm—Dickstein Shapiro Morin & Oshinsky LLP

(57) ABSTRACT

A method and apparatus for filtering an output voltage of a charge pump to reduce peak values which cause stress. A charge pump generates a pumped voltage which is filtered by an RC filter, for example a one or two Pi filter. The filter reduces the peak values of pump output voltage while reducing the amount of capacitance (and corresponding die size) required.

49 Claims, 11 Drawing Sheets

PUMP AREA REDUCTION THROUGH THE USE OF PASSIVE RC-FILTERS OR ACTIVE FILTERS

FIELD OF THE INVENTION

The present invention relates to semiconductor memory circuits and to charge pumps used therein. More particularly this invention relates to the reduction of the capacitance area required for a charge pump through the use of passive or active filters at the pump output.

BACKGROUND OF THE INVENTION

Charge pumps are well known in the art as an on-chip voltage generator capable of providing a voltage more positive than the most positive external supply voltage and/or more negative than the most negative external supply voltage. The advantages of charge pumps are also well known in the art, such as providing a bias voltage for the substrate of an integrated circuit employing N-type and P-type wells, or for providing greater output voltage swings, among other advantages.

For purpose of simplification, the following discussion will focus on the charge pumps which must produce a positive voltage greater than the most positive supply voltage VCC; however, the concepts discussed are also applicable to charge pumps designed to produce a negative voltage greater than a negative supply voltage.

Most charge pumps comprise some variation of the basic charge pump 10 shown in the schematic diagram of FIG. 1. The basic charge pump 10 configuration includes a ring oscillator 12 which provides a square wave or pulse train having voltage swings typically between ground and the most positive external power supply voltage, VCC. An invertor 14, buffer amplifier, or Schmnitt trigger circuit may be used to sharpen the edges of the oscillating output signal of the ring oscillator 12. A capacitor 16 is discharged into the load 24 through diode-connected transistor 20. (Typically the drain and gate of the diode-connected transistor are coupled together to form the anode of a diode and the source forms the cathode of the diode.) Transistor 18 is coupled to the external power supply voltage, VCC, at terminal 22. When the ring oscillator 12 produces a voltage close to ground, circuit node 26 is approximately at the voltage of the power supply minus a transistor threshold voltage, i.e. VCC-VT. When the ring oscillator 12 produces a voltage close to VCC, the incremental charge on capacitor 16 is delivered to the load 24. Capacitor 16 is prevented from discharging to VCC by the reverse bias on diode-connected transistor 18.

In the charge pump 10, one pulse of current is delivered to the load 24 for every clock cycle of the ring oscillator. Therefore, the charge pump 10 has an active half-cycle in which current is delivered to the load 24. However, charge pump 10 also has an inactive half-cycle in which capacitor 16 is precharged for the next active half-cycle. Although this inactive half-cycle is necessary to precharge the capacitor 16, no current is delivered to the load 24, which delays the attainment of the final desired voltage. Later advancements in charge pumps 10 have included injection of two current pulses into the load 24 for each cycle of the ring oscillator 12, by utilizing both states of each ring oscillator cycle. This is known in the art as a two phased pump.

In most integrated electronic circuits, such as a memory chip, it is desirable that the final voltage at the load be reached as quickly as possible. Proper device functions and attributes, such as the integrity of stored data, cannot be guaranteed until the load has reached the proper value.

However, the rapid voltage ramping on the load does pose some problems such as increased pump stresses and/or breakdown on circuits near the pump's output caused from voltage peaks. This is particularly true as oxides become thinner and channel lengths are shortened. Too high a voltage can cause a breakdown in particular areas of advanced fabricated devices. One technique used to reduce the high voltage peak related stresses is to add more capacitance to the output of the pump. Even with added capacitance on the output of the pump, there are still significant peaks experienced by those active circuits which first receive the pump output. These peaks can lead to premature oxide wearout or CHC (channel hot carrier) effects. For an N-channel transistor, the channel hot carriers would be electrons. These electrons can experience large fields near the drain making them very energetic. These energetic electrons may get injected into the gate oxide resulting in shifted circuit characteristics.

Reducing the peak voltage stresses by adding more capacitance at the output of the pump also means adding more die area. Even if space or die area is available, such as under buss routings, this is typically not effective because much of the added capacitance would be distributed away from the charge pump output. Therefore, there is a need for reducing the voltage peak stresses seen by circuits near the pump's output without increasing the capacitance and associated die area.

SUMMARY OF THE INVENTION

The present invention provides a unique method and apparatus that can be fabricated on a semiconductor integrated circuit for efficiently reducing pump peak voltage stresses on circuits near the charge pump's output while reducing required capacitance and hence die area. An RC filter is added at the output of the charge pump which adds resistance to effectively reduce pump peak voltage stresses while lowering the amount of capacitance required to achieve a desired result as compared to a capacitance only solution. The added filter can be a one or more stage passive filter or an actively controlled filter.

Further, in accordance with the present invention, multiple filters can be respectively used for multiple charge pump loads.

These and other advantages and features of the invention will become more apparent from the following detailed description of the invention which is provided in connection with the accompanying drawings.

DETAILED DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts.

Figure 1:
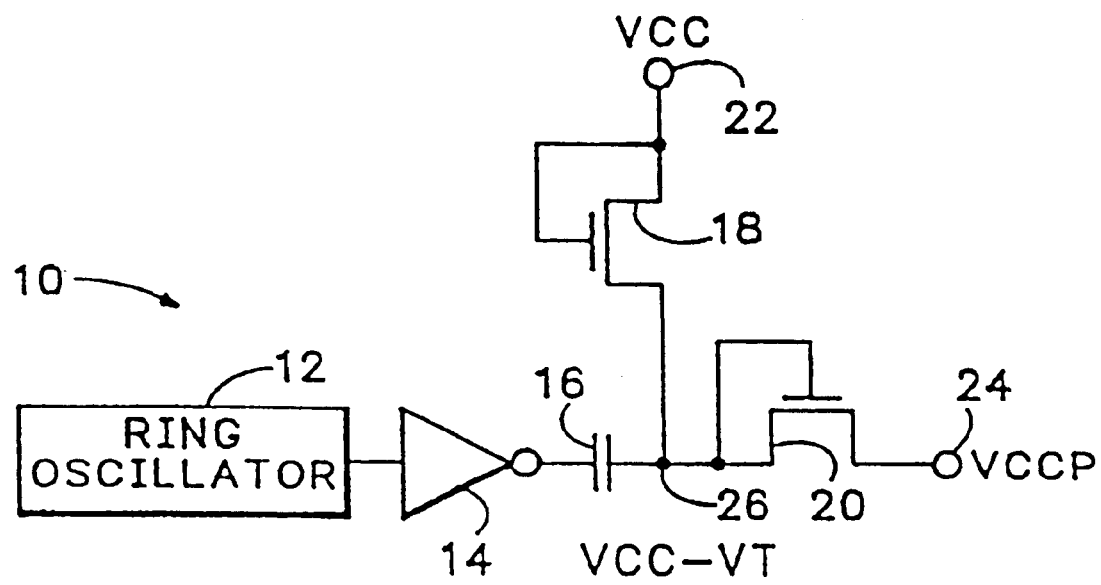
FIG. 1 is a combined block/schematic diagram of a prior art charge pump.

The following detail description describes a filter which is added to the output of a charge pump to increase resistance and reduce the peak voltage stresses at the output of charge pumps. Charge pump 10, as described previously in reference to FIG. 1, delivers a voltage to various destination points, circuits, or loads on an integrated circuit.

Figure 2:
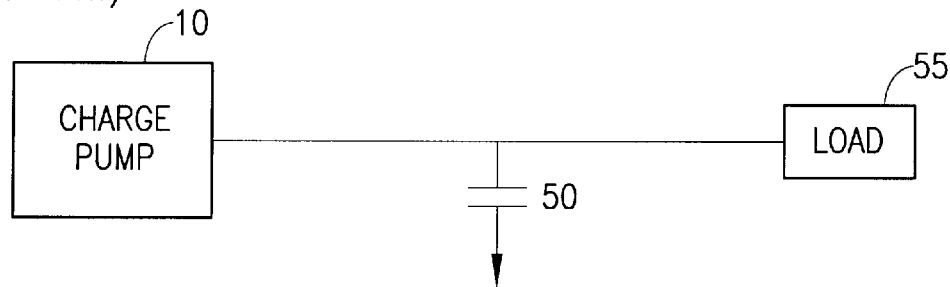
FIG. 2 is a block diagram of a typical charge pump and destination point.

As seen in FIG. 2, a typical charge pump 10 has an associated capacitance 50 located at the output of the charge pump 10. The output signal of the charge pump 10 is sent to a load 55. The load 55 is a destination point such as a local circuit which requires the voltage signal from charge pump 10.

Figure 3:
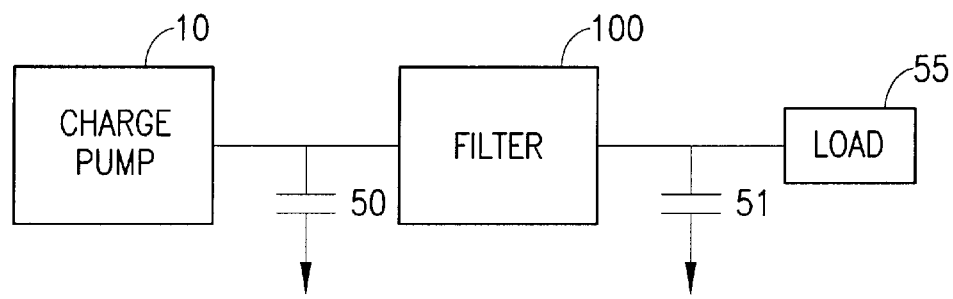
FIG. 3 is a block diagram of the present invention.

FIG. 3 shows a first embodiment of the present invention. Charge pump 10 may have an associated capacitance 50 located at the output of the charge pump 10. A filter 100 which adds an intentional resistance is also provided at the output of the charge pump 10 before the load 55. The filter 100 also has an associated capacitance 51. As will be described in further detail below, the filter 100 may be a passive RC filter or an actively controlled filter. The charge pump 10 and filter 100 may be integrated on a substrate within the integrated circuit.

Figure 4:
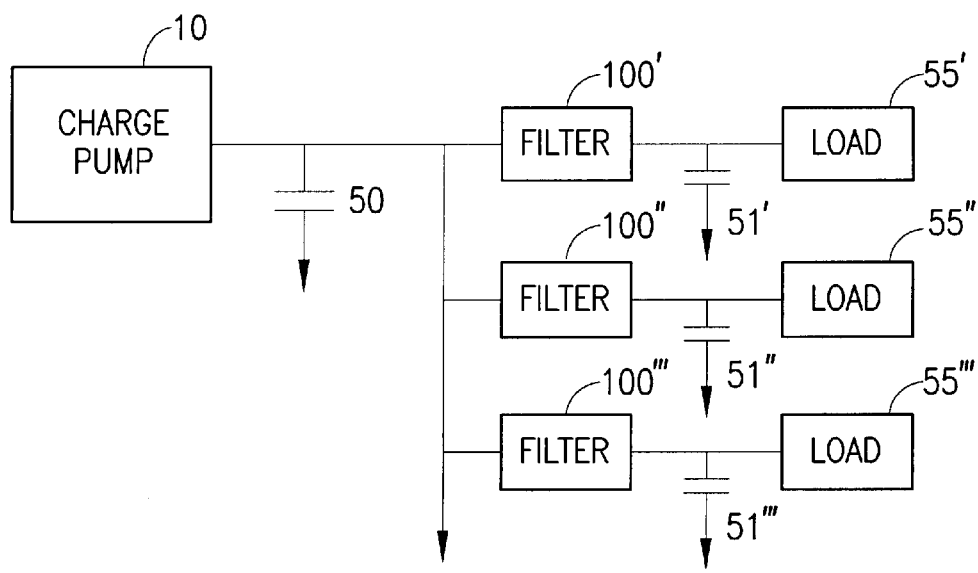
FIG. 4 is a block diagram of another embodiment of the present invention.

Referring now to FIG. 4, another embodiment of the present invention is shown which uses multiple filters 100', 100'', 100''' to add resistance and filter the charge pump 10 voltage signal headed to various load circuits 55', 55'', 55'''. Each filter 100', 100'', 100''' has an associated capacitance 51', 51'', 51'''. FIG. 4 merely depicts a block diagram of multiple filters 100', 100'', 100''' for multiple loads 55', 55'', 55''' and the use of more or less filters 100 and loads 55 will depend on the environment of use.

Figure 5:
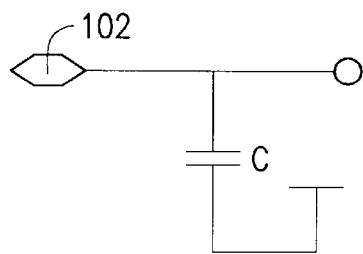
FIG. 5 is diagram of a typical charge pump output circuit.

The filter 100 may be in the form of an RC filter, such as a one Pi or two Pi filter or simply a resistor and capacitor. The RC filter approach does not require as much added capacitance to achieve the same level of peak voltage and RMS voltage reduction and other effective stress field reductions, while still achieving the high DC voltage specifications required by the down stream circuits as compared to capacitance only case. FIG. 5 represents a circuit diagram of a typical charge pump 10 output which includes a charge pump output node 102 connected to some capacitance C which corresponds to capacitor 50 of FIG. 2.

Figure 6A:
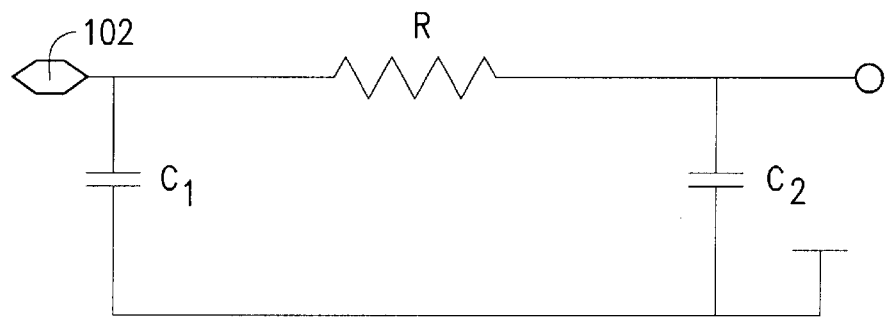
FIG. 6A is a diagram of a one-Pi charge pump output filter according to the present invention.
Figure 6B:
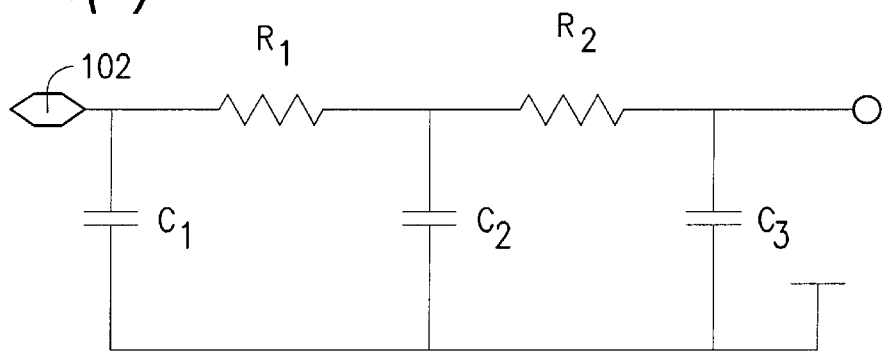
FIG. 6B is a diagram of a two-Pi charge pump output filter according to the present invention.
Figure 6C:
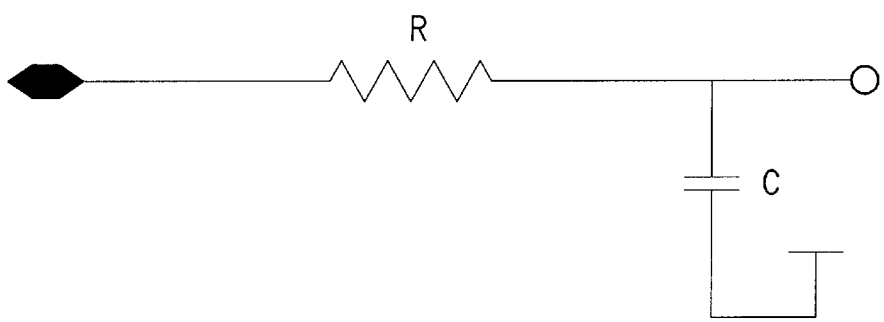
FIG. 6C is a diagram of an RC charge pump output filter with one resistor and one capacitor according to the present invention.

FIG. 6A represents a circuit diagram for a one Pi filter added to the output node 102 of a charge pump 10. The one Pi filter consists of one resistor R1 and two capacitors C1, C2 connected on either side of resistor R1. FIG. 6B represents a circuit diagram for a two Pi filter added to the output node 102 of a charge pump 10. The two Pi filter consists of two resistors R1, R2 in series and three capacitors C1, C2, C3 connected on either side of and between the resistors R1, R2. The use of a two Pi filter will allow further filtering of the charge pump 10 voltage which means lower voltage peaks but this may also require more die area and reduce the effectiveness, since a one Pi filter may be adequate for many applications. FIG. 6C represents a circuit diagram for a resistor/capacitor added to the output node 102 of a charge pump 10. The resistor/capacitor circuit consists of one resistor R and one capacitor C. The use of a one Pi, multiple Pi or resistor/capacitor circuit is determined by the intended environment.

Figure 7:
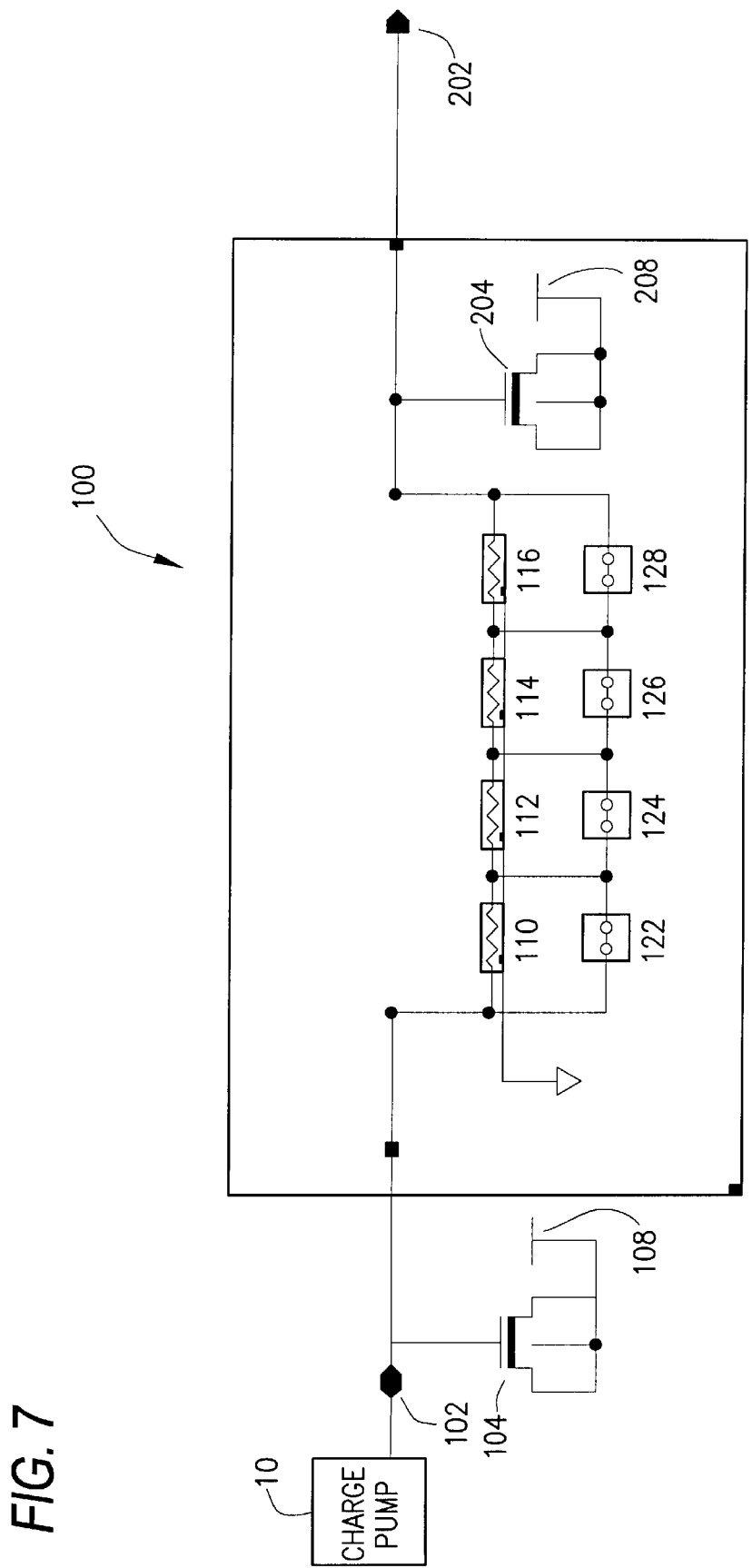
FIG. 7 is a circuit diagram of a passive type charge pump output filter.

Referring now to FIG. 7, a circuit diagram for a passive one Pi filter is shown. The charge pump 10 has an output node 102 connected to filter 100 and to a capacitor 104. The capacitor 104 is in the form of a depletion mode transistor with its source, drain, and well connections tied to VCC at connector 108. The filter 100 is comprised of multiple switches 122, 124, 126, 128, multiple resistors 110, 112, 114, 116, and a capacitor 204. The capacitor 204 is in the form of a depletion mode transistor with its source, drain, and well connections tied to VCC at connector 208. The output voltage of the charge pump 10 is filtered by filter 100 and filtered voltage is sent to the filter output node 202

The position of switches 122, 124, 126 and 128 are pre-selected and set during fabrication of the integrated circuit. Switches 122, 124, 126, 128 are set as either closed are open and determine which resistors 110, 112, 114, 116 will be used for filter 100 and therefore serve to set the filtering characteristics.

As an example, if switch 122 and 126 are open resistors 110 and 114 would be serially connected between capacitors 104 and 204. Accordingly, the filtering characteristics of filter 100 can be easily changed by programming switches 122, 124, 126, 128 to be opened or closed. It should be understood that the values of resistors 110, 112, 114, 116 and the values of capacitors 104 and 204 will vary depending upon the intended application.

Figure 8:
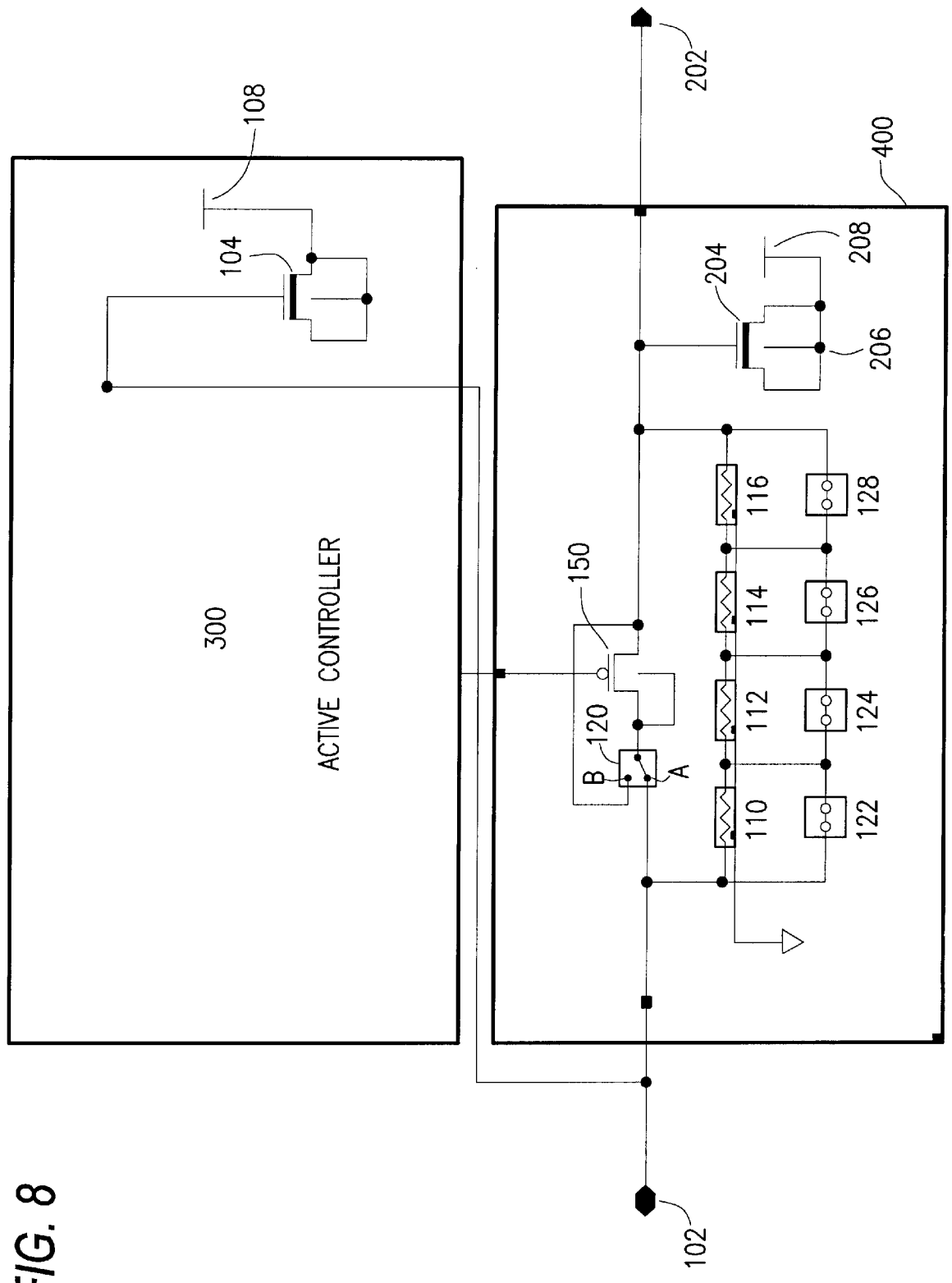
FIG. 8 is a schematic diagram of an active type charge pump output filter which includes an active controller.

FIG. 8 is a circuit diagram of another embodiment of the present invention employing an actively controlled filter 400. The active controlled resistance filter 400 of FIG. 8 is identical to the intentional resistance filter 100 of FIG. 7, except that a P-channel gate 150 and option switch 120 have been added. The P-channel gate 150 is connected to an active controller 300. Further, capacitor 104 in the form of a depletion mode transistor with its source, drain, and well connections tied to VCC at connector 108 is now located within the active controller 300 circuit.

The active controller 300 dynamically controls the characteristics of filter 400 by controlling the resistance of the P-channel gate 150. When the P-channel gate 150 is less resistive the voltage at the output node 102 travels through the least restrictive path which includes the P-channel gate 150 and largely by passes resistors 110, 112, 114, 116. When the P-channel gate 150 is highly resistive the voltage at the output node 102 travels through the path which may include one or more of resistors 110, 112, 114, 116 as determined by the settings of switches 122, 124, 126, 128. Therefore, the active controller 300 controls the actively controlled filter 400 by varying the resistance of the P-channel gate 150. The resistance of the P-channel gate 150 is also in parallel with the resistance string 110, 112, 114, 116 and together with the resistors selected by the setting of switches 122, 124, 126, and 128, determine the resistance and hence the filtering characteristics of the filter.

In operation a charge pump 10 delivers an increased voltage signal to output node 102. The output node 102 is connected to capacitor 104 and to the filter 400. Filter 400 can be set during fabrication to remain as a passive filter by having circuit switch 120 located in the "B" position. This would always force the pump output voltage to travel through the selected resistors 110, 112, 114, 116.

Filter 400 can also be set to be an active filter position by having circuit switch 120 set during fabrication in the "A" position. With switch 120 in the "A" position, the pump output voltage signal travels to the P-channel gate 150 where it will encounter an adjustable and variable resistance from the P-channel gate 150 which is in parallel with selected resistors of the resistor string 110, 112, 114, and 116. The resistance of the P-channel gate 150 is determined by the level of control signal applied to the gate thereof.

Figure 9:
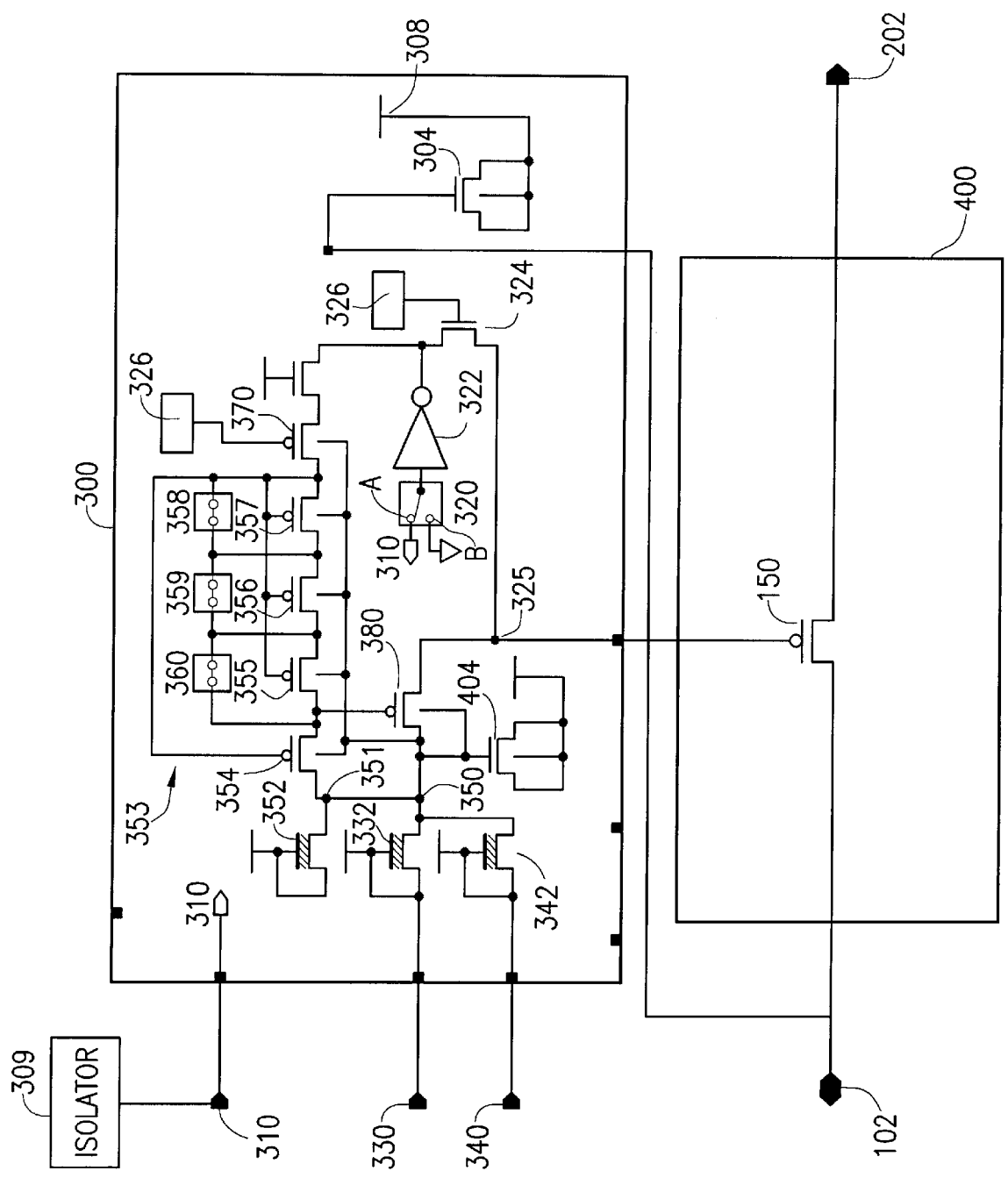
FIG. 9 is a diagram of an active controller circuit.

A representative active controller 300 is now described in reference to FIG. 9 where the details of the actively controlled filter 400 are omitted, except for the P-channel gate 150. However, it should be understood that the controlled filter 400 in FIG. 9 has the same construction as in FIG. 8. The P-channel gate 150 is connected to various components of the active controller 300 which work in combination to make the P-channel gate 150 have a variable resistance when various predetermined conditions are met. An isolator 309 is used to enable charge pump 10 (see FIG. 1) and is also used to enable or disable the active filter such that no power is wasted when the charge pump is off. Isolator 309 has an associated node 310 which is coupled to switch 320, inverter 322, and a source transistor 324. The switch 320, inverter 322, and transistor 324 vary the resistance of the P-channel gate 150 based upon isolator 309. When isolator 309 has enabled charge pump 10, transistor 324 provides a current load on node 325 which pulls the P-channel gate 150 towards ground, reducing its channel resistance. However, transistor 380 can overcome the current load of transistor 324 and pull the P-channel gate 150 higher if necessary. When isolator 309 is not enabling charge pump 10, the P-channel gate 150 is pulled higher thereby increasing the resistance of its corresponding channel region.

The charge pump 10 may be constructed as two opposite phase pumps each with an output node 330, 340. The opposite phase pumps work complementary to provide a constant pumping source. The output nodes 330, 340 are connected to diodes 332 and 342 respectively and then are connected to one another at node 350. Node 350 is connected to node 351 which is linked to a diode 352 and a voltage divider 353. The voltage divider 353 is comprised of four P-channel gate transistors 354, 355, 356, 357 and three switches 358, 359, 360. In the circuit depicted, transistors 355 and 357 are optioned out by use of the various switches 358, 359, 360. The remaining transistors 354 and 356 form the P-channel voltage divider 353. The voltage divider 353 in conjunction with transistors 370, 380 and capacitor 404 provide a shifted reference with respect to a reference voltage 326. Transistor 380 also provides a path to pull the P-channel gate 150 to a higher voltage if the voltage at node 350 rises above the shifted reference value. This in turn makes the P-channel 150 become more resistive filtering the pump more aggressively.

Figure 10:
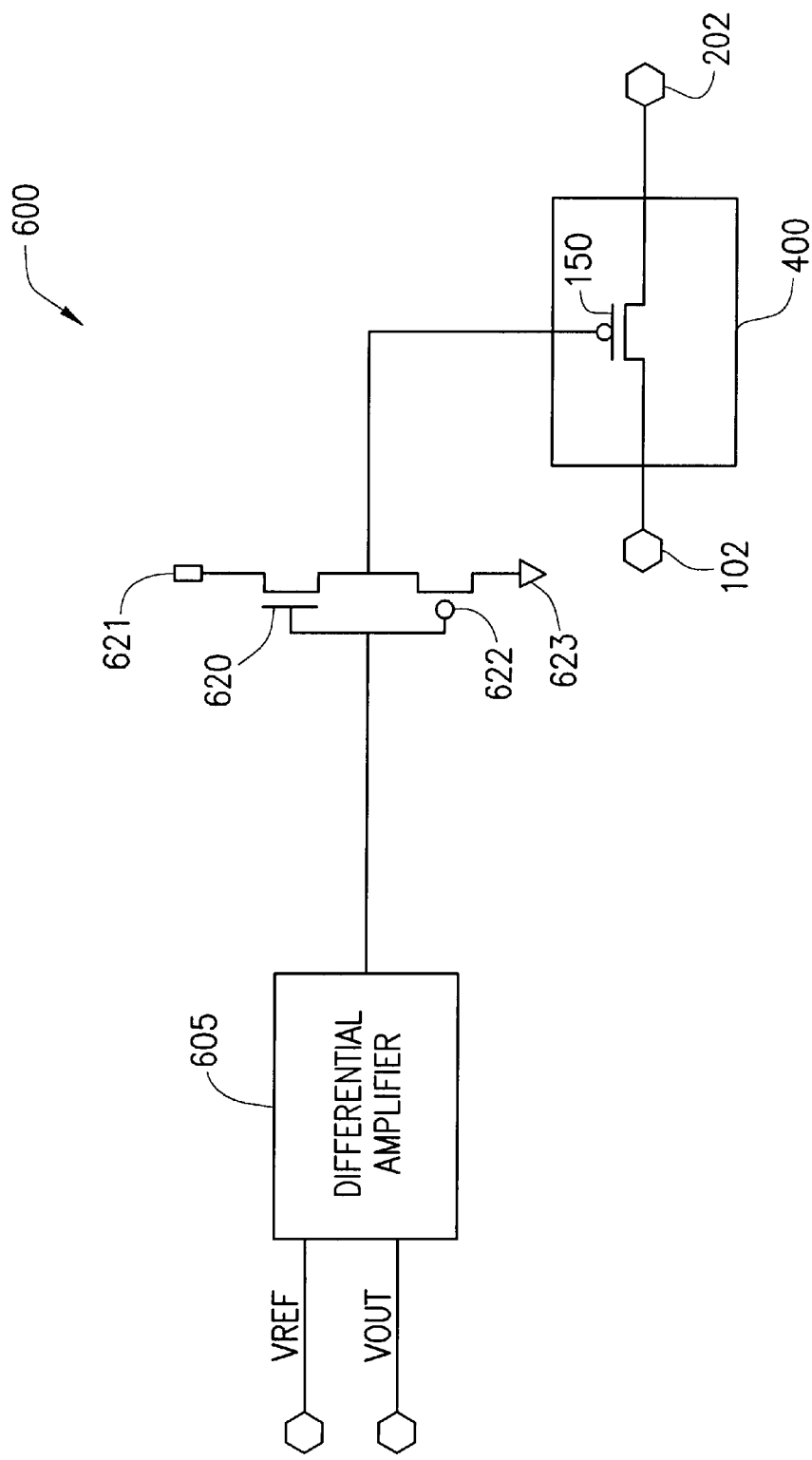
FIG. 10 is a block diagram of a second active controller circuit according to the present invention.

FIG. 10 illustrates, in block form, another embodiment of an active controller circuit 600 where the details of the actively controlled filter 400 are omitted, except for the P-channel gate 150. However, it should be understood that the controlled filter 400 in FIG. 10 has the same construction as in FIG. 8. The P-channel gate 150 is connected to various components of the active controller 600 which work in combination to make the P-channel gate 150 have a variable resistance when various predetermined conditions are met.

In operation, the active controller circuit 600 controls the resistance level of the P-channel gate 150 so that the resistance of the P-channel gate 150 acts as the filter and the resistance string 110, 112, 114, and 116 of filter 400 is merely a safety filter if the resistance of the P-Channel gate is too high. The active controller circuit 600 comprises several main components which includes a differential amplifier 605. The differential amplifier 605 compares a reference voltage VREF with a divided or shifted down version of the charge pump output voltage VOUT. The differential amplifier 605 is coupled to the gate of an N-channel transistor 620 and the gate of a P-channel transistor 622. The drain of the P-channel transistor 622 is coupled to ground 623. The drain of the N-channel transistor 620 is coupled to the charge pump output 621. The source of the N-channel transistor 620 and the source of the P-channel transistor 622 are coupled to the actively controlled P-channel gate 150.

In operation, the differential amplifier 605 compares VREF and VOUT and when the charge pump output voltage VOUT is higher than VREF, which is an indication of peak voltages, the N-channel transistor 620 is turned on and the P-channel transistor 622 is turned off. The N-channel transistor 620 is coupled to the charge pump output voltage 621 which pulls the actively controlled P-channel gate 150 high making the P-channel gate 150 more resistive. When the charge pump output voltage VOUT is lower than VREF, the N-channel transistor 620 is turned off and the P-channel transistor 622 is turned on. Since the gate of the P-channel transistor 622 is referenced to ground 623 the active controlled P-channel gate 150 is pulled low making it less resistive.

The active controller circuit 600 of FIG. 10 allows the resistance of the active controlled P-channel gate 150 to adjust its resistance level in a corresponding fashion with the output voltage of the charge pump 10. Therefore, the resistance of the P-channel gate 150 is increased or decreased with the charge pump voltage peaks. The active controller circuit 600 allows the P-channel gate 150 to act as the resistance within an RC filter. When the P-channel gate 150 acts as the resistance of an RC filter the resistance string 110, 112, 114, and 116 of filter 400 acts as a safety or back up filter in the event that the P-channel gate 150 is too resistive.

As will be described with reference to FIGS. 11–14 the use of an RC filter allows filtering of the charge pump voltage signal using less capacitance and therefore less die area. An actively controlled filter, such as the one described in reference to FIG. 10, was used to generate the graphical data of FIGS. 11–14, however a one Pi, two Pi, or a single resistor and capacitor (RC) filter would also provide filtering characteristics.

Figure 11:
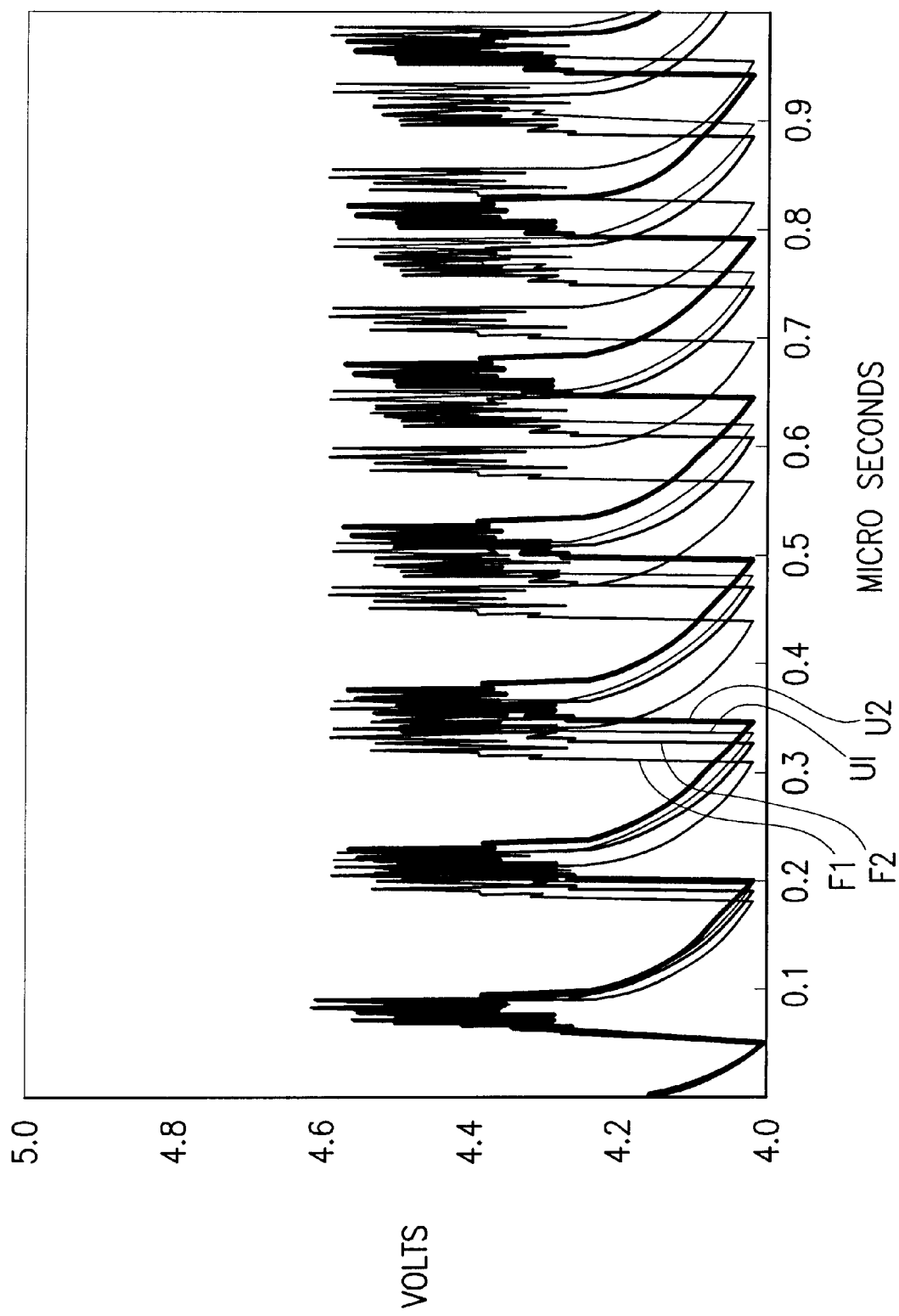
FIG. 11 is a graphical illustration comparing voltage readings from a typical charge pump output filter seen in FIG. 5 with a charge pump output filter, using a two Pi filter according to the present invention seen in FIG. 6B.

Referring to FIG. 11, a graph illustration of the voltage reading at the output node of an unfiltered circuit, as seen in FIG. 5, and the output node of an actively controlled filtered circuit, as seen in FIG. 10, is depicted. FIG. 11 shows four distinct voltage readings of which two (U1, U2) are from unfiltered circuits and two (F1, F2) are from filtered circuits. Line U1 is the voltage taken from an unfiltered circuit with a pump output capacitance of 275 picofarads. Line U2 is the voltage reading taken from an unfiltered circuit with a pump output capacitance of 335 picofarads. Line F1 is the voltage reading taken from the actively controlled filtered circuit, with a total capacitance of 120 picofarads. Line F2 is the voltage reading taken from the actively controlled filtered circuit, with a total capacitance of 180 picofarads.

The voltage readings range in the area of 4.0 volts up to 4.6 volts. Initially the readings overlap one another as the charge pump cycles from about 4.0 volts to 4.6 volts. The voltage signal is bumping up and down in short cycles in a pumping action. The signal rises and then the charge pump turns off because the regulator of the charge pump is signaled that the required voltage is met. Then the signal from the charge pump shuts off and the voltage reading loads down. When the regulator senses that the value is too low it turns the charge pump on, hence the pumping action again.

After several rises during the pumping action the four readings start to separate due to the effect of the capacitance. The larger the capacitance the longer it takes for the voltage to rise and therefore the regulator which shuts off the charge pump is delayed. After several charge pump cycles the delays are noticeable. The important aspect to understand from FIG. 11 is that the voltage readings stemming from the actively controlled filtered circuits F1, F2 achieves the same voltage readings as the unfiltered circuits U1, U2, but does so with much less capacitance. In other words, where the unfiltered circuit of FIG. 5 has an output capacitance of 275 pf for U1 and 335 pf for U2, the filtered pump has a total capacitance value of 120 pf for F1 and 180 pf for F2. Since there is less capacitance required with the filter circuit, the corresponding capacitor die area can be reduced.

Figure 12:
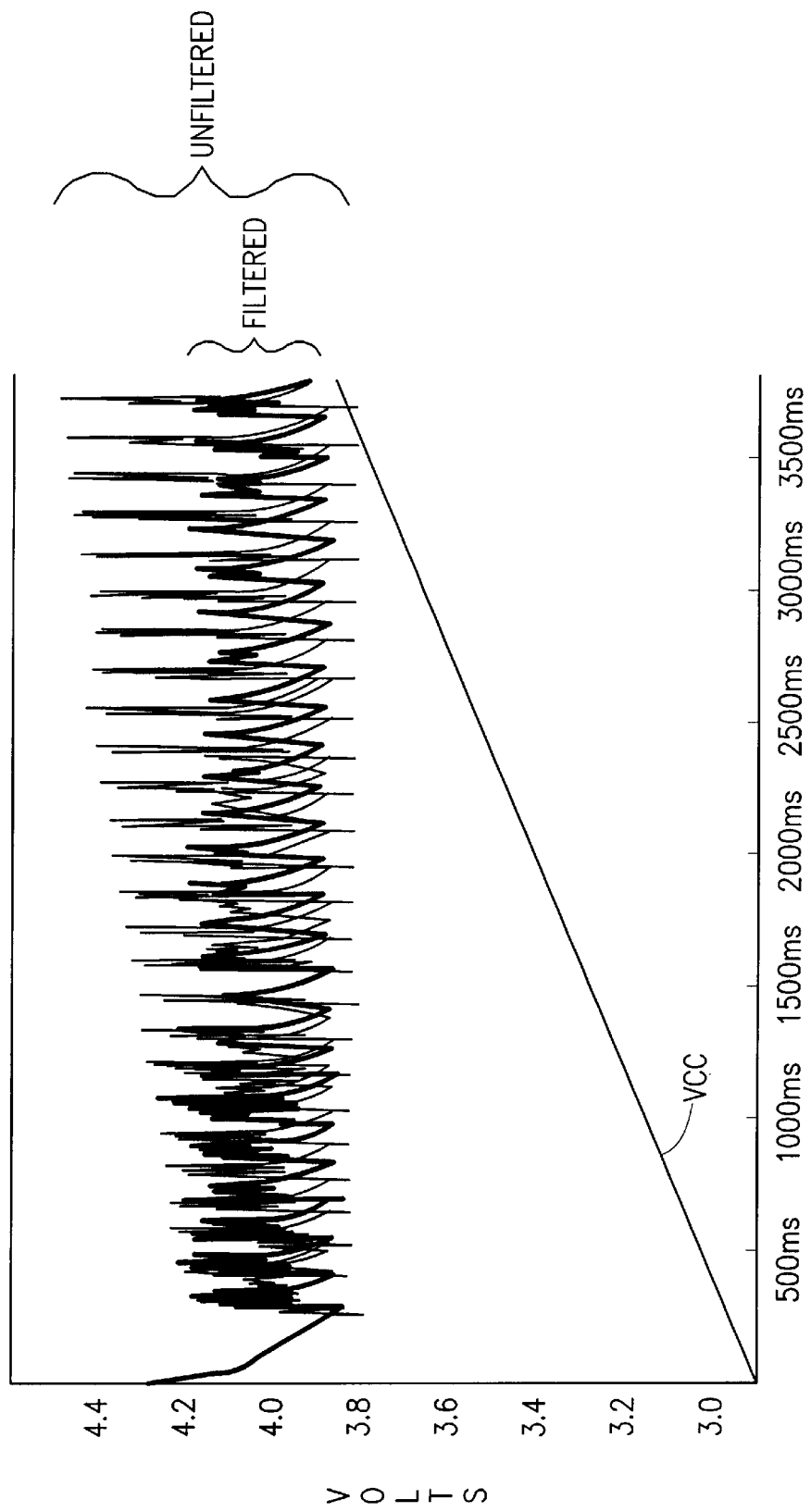
FIG. 12 is a graphical illustration of the voltage reading of both the filtered and unfiltered charge pump circuits where each circuit has a total capacitance of 120 pf.
Figure 13:
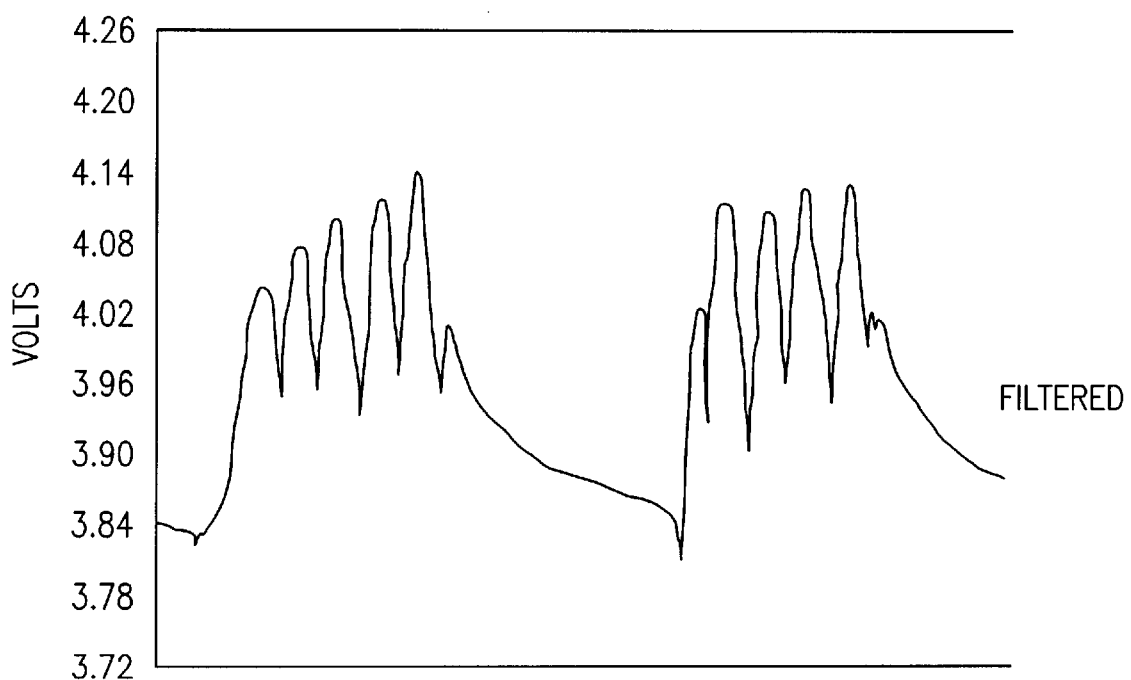
FIG. 13 is a detailed graphical illustration of the voltage reading of the filtered pump circuit with a total capacitance of 120 pf.
Figure 14:
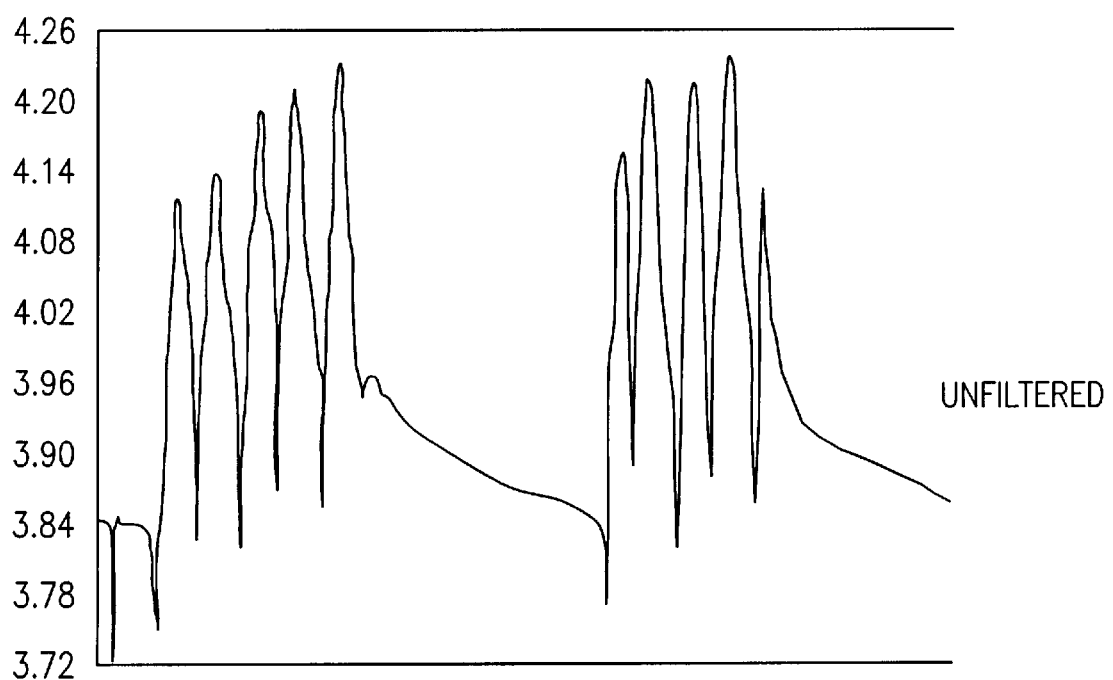
FIG. 14 is a detailed graphical illustration of the voltage reading of the unfiltered charge pump circuit with a total capacitance of 120 pf.

FIGS. 12–14 illustrate the effects of using an actively controlled filter, such as shown in FIG. 10, at the output of a charge pump. The slow rising line in FIG. 12 is the source voltage VCC which helps to illustrate the fact that as VCC rises the unfiltered voltage peak values also rise.

FIG. 12 illustrates the differences in output voltage of a conventional charge pump, e.g. a charge pump having the output circuit of FIG. 5, compared to a charge pump having an active output filter circuit, such as illustrated in FIG. 10. Both output circuits have the same capacitance of 120 pf. As shown, the unfiltered charge pump output produces a higher peak voltage, as compared with the charge pump output with an actively controlled filter.

FIGS. 13, 14 respectively shows in greater detail the output voltage of a filtered (13) and unfiltered (14) charge pump, again illustrating a reduction in peak output voltage when using the active filter, even when they both have a total output capacitance of 120 pf.

Referring now to FIGS. 12–14 we see a graphical representation of data illustrating the effect of using a filter 100 at the output of the charge pump 10. FIGS. 12–14 show the voltage reading of a filtered signal compared with an unfiltered signal. The filtered and unfiltered circuits shown in FIGS. 12–14 have a total capacitance of 120 picofarads. The filtered signal stems from an actively controlled filter as described above, see FIG. 10. Evident from FIGS. 12–14 is the fact that the unfiltered circuit has voltage peaks above the filtered signal. These high voltage peaks cause stress, wearout and CHC effects. The filtered circuit obtains the needed higher voltage for the intended loads, but does not have excessive voltage peaks.

Specifically, FIG. 12 shows the voltage reading of a filtered and an unfiltered circuit over an extended time period. FIG. 13 shows the filtered voltage reading of FIG. 12 in a shortened time period. Evident from FIG. 13 is that the filtered peak voltage is about 4.14 volts. FIG. 14 shows the unfiltered voltage reading of FIG. 12 in the same shortened time period. Evident from FIG. 14 is that the unfiltered peak voltage reading is close to 4.26 volts. FIGS. 12–14 show the peak voltages possible for an unfiltered circuit and the reduced peak voltages with a filtered circuit.

As evident from FIGS. 12–14, the use of a filter, such as an actively controlled filter, at the output of a charge pump can reduce the needed capacitance required to limit voltage peaks. Since less capacitance is needed at the output of the charge pump the circuit can consume less die area.

Figure 15:
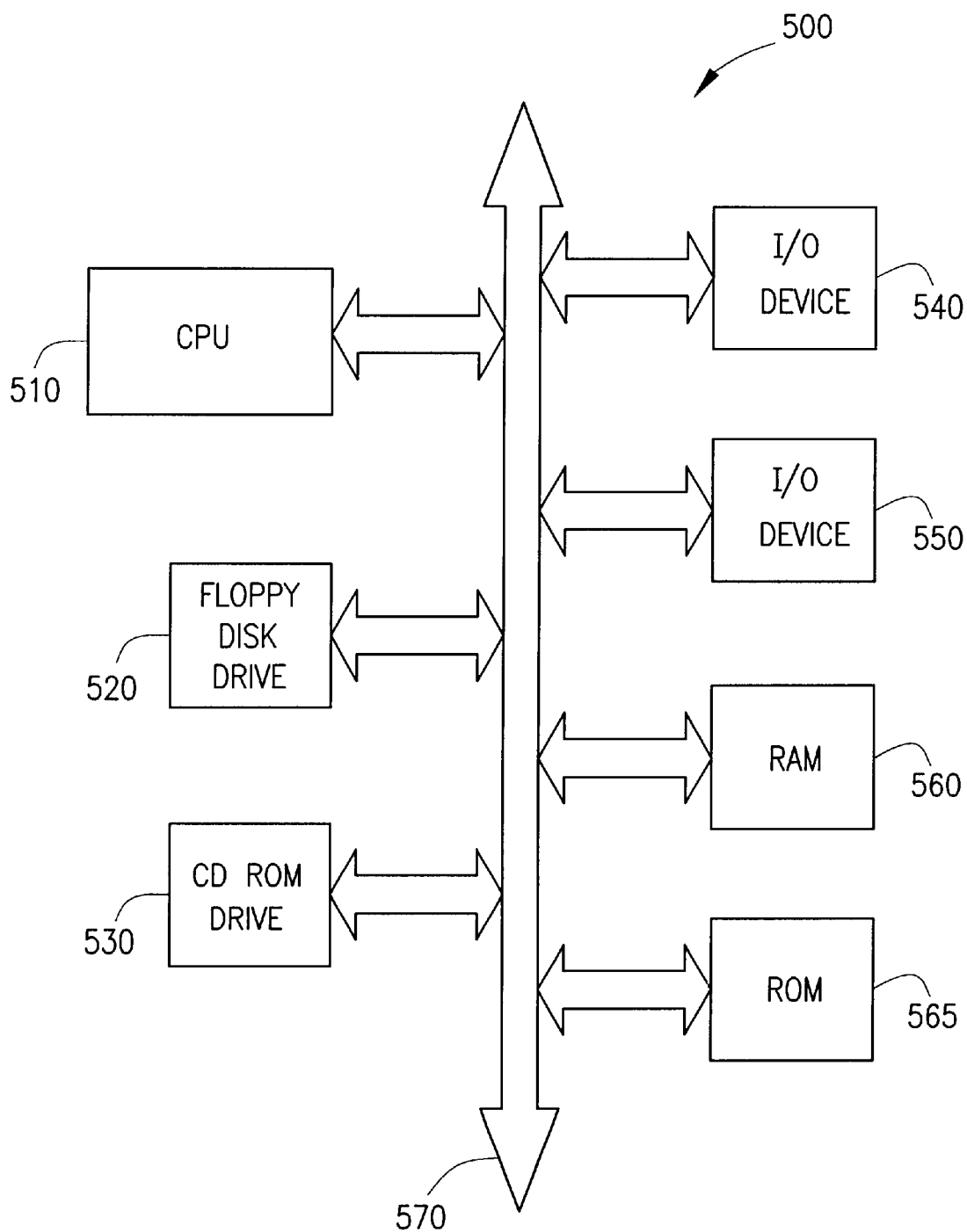
FIG. 15 is a block diagram of a processor based system using the charge pump output filter.

FIG. 15 is a block diagram of a processor-based system 500 which includes a passive filter 100 or active filter 400 according to the present invention in one or more operative components of the system. The processor based system 500, such as a computer system, for example, generally comprises a central processing unit (CPU) 510, for example, a microprocessor, that communicates with one or more input/output (I/O) devices 540, 550 over a bus 570. The processor-based system 500 also includes read-only memory (ROM) 565 and may include peripheral devices such as a floppy disk drive 520 and a compact disk (CD) ROM drive 530 that also communicates with the CPU 510 over the bus 570 as is well known in the art. The computer system 500 also includes random access memory (RAM) 560. It may also be desirable to integrate the processor 510 and memory 560 on a single IC chip. ROM 565 may also be integrated on that same chip. At least one of the processor 510, memory 560, and ROM 565 contains at least one passive filter 100 or active filter 400 according to the invention.

Many of these figures show their corresponding capacitors referenced to VCC, however this is a capacitor field reduction methodology and may be referenced to other voltages if required (i.e. ground).

The above descriptions and drawings illustrate preferred embodiments which achieve the features, and advantages of the present invention. It is not intended that the present invention be limited to the illustrated embodiments. Any modifications of the present invention which comes within the spirit and scope of the following claims should be considered part of the present invention.

What is claimed as new and desired to be protected by Letters Patent of the United States is:

1. A semiconductor circuit comprising:
   a charge pump for providing a pumped supply voltage to at least one circuit; and a filter for reducing stress cause by a peak voltage of said pumped supply voltage to said at least one circuit, said filter coupled to an output node of said charge pump and comprising
   a first capacitor with a first terminal coupled to the output node of said charge pump and a second terminal coupled to a ground potential;
   a resistor network coupled between the output node of said charge pump and the output of said filter;
   a switch circuit for altering the resistance characteristics of said resistor network; and
   a second capacitor coupled to said output of said filter.

2. The semiconductor circuit of claim 1, wherein said filter is a passive filter.

3. The semiconductor circuit of claim 1, wherein said filter comprises a Pi filter circuit.

4. The semiconductor circuit of claim 1, wherein said filter comprises a two Pi filter circuit.

5. The semiconductor circuit of claim 1, wherein said filter is an active filter.

6. The semiconductor circuit of claim 5, wherein said active filter is operated by a controller for controlling the filtering characteristics of said active filter in response to operating conditions of said charge pump.

7. The semiconductor circuit of claim 1, further comprising:
   at least a second filter located at said output node for receiving and reducing
   said peak output voltage of said charge pump.

8. The semiconductor circuit of claim 7, wherein said filters are coupled to respective loads.

9. The semiconductor circuit of claim 1, wherein said filter comprises: an RC filter.

10. The semiconductor circuit of claim 1, wherein said switch circuit can be pre-set to impart predetermined resistance characteristics to the resistance network.

11. A semiconductor circuit comprising:
   a charge pump; and
   a Pi filter coupled to an output node of said charge pump for receiving and reducing
   a peak voltage of said charge pump; wherein said Pi filter further comprises:
      a first capacitor coupled to the output node of said charge pump;
      a gating element having an input coupled to the output node of said charge pump and an output coupled to an output of said filter, said gating element having a control input;
      a resistor network coupled between the output of said charge pump and the output of said Pi filter;
      a switch network for altering the resistance characteristics of said resistor network; and
      a second capacitor coupled to the output of said filter.

12. The semiconductor circuit of claim 11 further comprises a switch element for enabling or disabling operation of said gating element.

13. The semiconductor circuit of claim 12 wherein said switch element is arranged to selectively make said filter an active filter or a passive filter.

14. The semiconductor circuit of claim 11 wherein said switch circuit can be pre-set to impart predetermined resistance characteristics to such resistance network.

15. The semiconductor circuit of claim 11, further comprising an active controller circuit for supplying a control signal to said control input.

16. The semiconductor circuit of claim 15, wherein said active controller circuit controls the resistance of said gating element, to affect the filtering characteristics of said filter gate.

17. The semiconductor circuit of claim 15, wherein said first capacitor is located in said active controller circuit.

18. The semiconductor circuit of claim 15, wherein said active controller generates said control signal in response to operating conditions of said charge pump.

19. The semiconductor circuit of claim 18, wherein said active controller varies said control signal based upon a comparison between a reference voltage and said peak output voltage.

20. A method of providing a charge pump output voltage, said method comprising:
   generating a pumped supply voltage with a charge pump to at least one circuit;
   filtering said pumped supply voltage to reduce stress caused by a peak voltage to said at least one circuit using a first filter; and
   controlling the filtering characteristics of said first filter by controlling the resistance of a transistor gate within said first filter.

21. The method of claim 20, further comprising the steps of:
   dynamically controlling the filtering characteristics of said first filter with a controller which is responsive to the operating characteristics of said charge pump.

22. The method of claim 21, wherein said controller varies the resistance of said transistor gate based upon when said controller determines that said charge pump is on.

23. The method of claim 20, wherein said transistor gate is a P-channel gate.

24. The method of claim 20, further comprising filtering said output of said charge pump with at least a second filter, and applying the output voltage of said first and second filters to respective loads.

25. The method of claim 20, wherein said first filter comprises a one Pi filter.

26. The method of claim 20, wherein said first filter comprises a two Pi filter.

27. The method of claim 20, wherein said first filter comprises a resistor coupled to said charge pump output node and a capacitor coupled said resistor.

28. The method of claim 20, further comprising presetting filtering characteristics of said filter by presetting a resistance network in said first filter.

29. A method of providing a charge pump output voltage, said method comprising:
   generating a voltage with a charge pump;
   filtering the output of said charge pump with a first filter;
   controlling the filtering characteristics of said first filter by controlling the resistance of a transistor gate within said first filter; and
   dynamically controlling the filtering characteristics of said first filter with a controller which is responsive to the operating characteristics of said charge pump,
   wherein said controller varies the resistance of said transistor gate based upon a comparison between a reference voltage and said voltage of said charge pump.

30. A processor system comprising:
   a processor; and,
   a memory circuit connected to said processor, at least one of said processor and said memory circuit comprising:
      a charge pump for providing a pumped supply voltage to at least one circuit; and
      a first filter for reducing stress caused by a peak voltage of said pumped supply voltage to said at least one circuit, said filter connected to the output of said charge pump and comprising
         a first capacitor with a first terminal coupled to an output node of said charge pump;
         a resistor network coupled between said output of said charge pump and said output of said filter;
         a switch circuit for altering the resistance characteristics of said resistor network; and
         a second capacitor coupled to said output of said filter.

31. The processor system of claim 30, wherein said first filter is a passive filter.

32. The processor system of claim 30, wherein said first filter comprises an RC filter.

33. The processor system of claim 32, wherein said RC filter comprises a one Pi filter circuit.

34. The processor system of claim 32, wherein said RC filter comprises a two Pi filter circuit.

35. The processor system of claim 32, wherein said RC filter comprises a resistor coupled to said charge pump output and a capacitor coupled to said resistor.

36. The processor system of claim 30, wherein said filter comprises an active filter.

37. The processor system of claim 36, further comprising a controller for controlling the filtering characteristics of said active filter in response to the operating conditions of said charge pump.

38. The processor system of claim 30, further comprising:
at least a second filter connected to said output for receiving and reducing said peak output voltage of said charge pump.

39. The processor system of claim 38, wherein said filters are coupled to respective loads.

40. The processor system of claim 30, wherein said switch circuit can be pre-set to impart predetermined resistance characteristics to the resistance network.

41. A processor system comprising
a processor; and,
a memory circuit connected to said processor, at least one of said processor and said memory circuit comprising:
a charge pump; and
a first filter connected to the output of said charge pump for receiving and reducing
a peak output voltage of said charge pump, wherein said filter further is an active filter and comprises,
a first capacitor with a first terminal coupled to an output node of said charge pump;
a resistor network coupled between said output of said charge pump and said output of said filter;
a switch circuit for altering the resistance characteristics of said resistor network; and
a second capacitor coupled to said output of said filter; and
a controller for controlling the filtering characteristics of said active filter in response to the operating conditions of said charge pump, wherein said controller varies said resistance of said active filter based upon a comparison between a reference voltage and said peak output voltage.

42. A processor system comprising:
a processor; and,
a memory circuit connected to said processor, at least one of said processor and said memory circuit comprising:
a charge pump; and
a first filter connected to the output of said charge pump for receiving and reducing a peak output voltage of said charge pump, wherein said first filter further comprises,
a first capacitor with a first terminal coupled to an output node of said charge pump;
a resistor network coupled between said output of said charge pump and said output of said filter;
a switch circuit for altering the resistance characteristics of said resistor network; and
a second capacitor coupled to said output of said filter; an one Pi RC filter comprising,
a first capacitor coupled to an output node of said charge pump;
a gating element having an input coupled to said output of said charge pump and an output coupled to an output of said filter, said gating element having a control input;
a resistor network coupled between said output of said charge pump and said output of said filter;
a switch circuit for altering the resistance characteristics of said resistor network; and
a second capacitor coupled to said output of said filter.

43. The processor system of claim 42, further comprising a switch circuit for enabling or disabling operation of said gating element.

44. The processor system of claim 43, wherein said switch circuit is arranged to selectively make said filter an active filter or a passive filter.

45. The processor system of claim 42, wherein said switch circuit occurred can be pre-set to impart predetermined resistance characteristics to said resistance network.

46. The processor system of claim 42, further comprising an active controller circuit for supplying a control signal to said control input.

47. The processor system of claim 46, wherein said first capacitor is located in said active controller circuit.

48. The processor system of claim 46, wherein said active controller circuit controls the resistance of said gating element, to affect the filtering characteristics of said filter gate.

49. The processor system of claim 46, wherein said active controller generates said control signal in response to operating characteristics of said charge pump.

* * * * *